United States Patent
Wang et al.

(10) Patent No.: US 9,601,373 B2
(45) Date of Patent: Mar. 21, 2017

(54) SEMICONDUCTOR DEVICE AND METHOD FOR MANUFACTURING THE SAME

(71) Applicant: TAIWAN SEMICONDUCTOR MANUFACTURING CO., LTD., Hsinchu (TW)

(72) Inventors: Chin-Shan Wang, Hsinchu (TW); Jian-Hong Lin, Yunlin County (TW); Shun-Yi Lee, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/145,306

(22) Filed: May 3, 2016

(65) Prior Publication Data

US 2016/0247721 A1   Aug. 25, 2016

Related U.S. Application Data

(62) Division of application No. 14/516,673, filed on Oct. 17, 2014, now Pat. No. 9,356,016.

(51) Int. Cl.
| | |
|---|---|
| *H01L 27/07* | (2006.01) |
| *H01L 21/768* | (2006.01) |
| *H01L 27/06* | (2006.01) |
| *H01L 49/02* | (2006.01) |
| *H01L 23/522* | (2006.01) |
| *H01L 29/423* | (2006.01) |
| *H01L 29/49* | (2006.01) |
| *H01L 23/485* | (2006.01) |
| *H01L 29/66* | (2006.01) |
| *H01L 29/94* | (2006.01) |

(52) U.S. Cl.
CPC ...... *H01L 21/76895* (2013.01); *H01L 23/485* (2013.01); *H01L 23/5223* (2013.01); *H01L 27/0629* (2013.01); *H01L 27/0635* (2013.01); *H01L 27/0716* (2013.01); *H01L 28/60* (2013.01); *H01L 28/86* (2013.01); *H01L 28/90* (2013.01); *H01L 29/42372* (2013.01); *H01L 29/4916* (2013.01); *H01L 29/66568* (2013.01); *H01L 21/76831* (2013.01); *H01L 29/6659* (2013.01); *H01L 29/94* (2013.01); *H01L 2924/0002* (2013.01)

(58) Field of Classification Search
CPC ........................... H01L 27/07; H01L 27/0711
See application file for complete search history.

(56) References Cited

U.S. PATENT DOCUMENTS

2010/0009481 A1* 1/2010 Tseng ............... H01L 27/1288
438/34
2011/0303922 A1  12/2011 Cho et al.

* cited by examiner

*Primary Examiner* — Cheung Lee
(74) *Attorney, Agent, or Firm* — Maschoff Brennan

(57) ABSTRACT

A method for manufacturing a semiconductor device is provided. The method includes the following operations: (i) forming a transistor having a source, a drain and a gate on a semiconductor substrate; (ii) forming a conductive contact located on and in contact with at least one of the source and the drain; and (iii) forming a capacitor having a first electrode and a second electrode on the semiconductor substrate, in which at least one of the first and second electrodes is formed using front-end-of line (FEOL) processes or middle-end-of line (MEOL) processes.

19 Claims, 17 Drawing Sheets

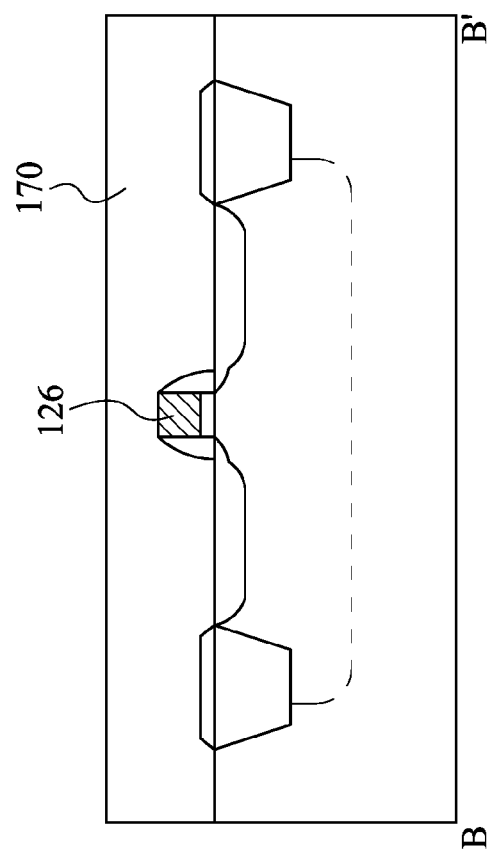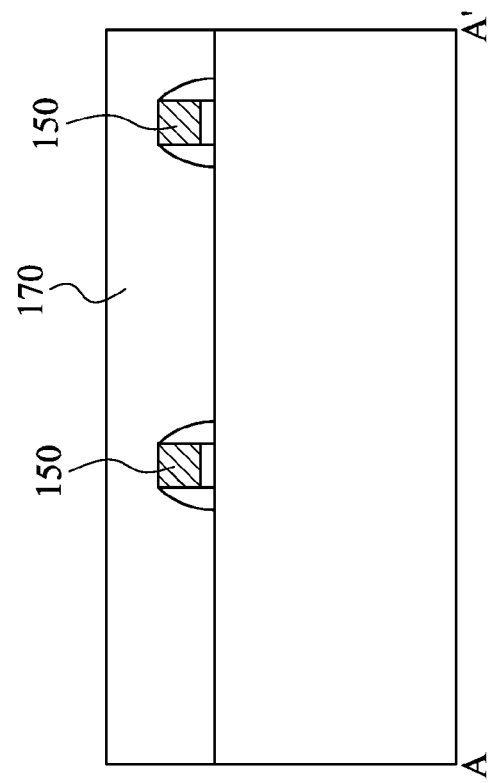
Fig. 5

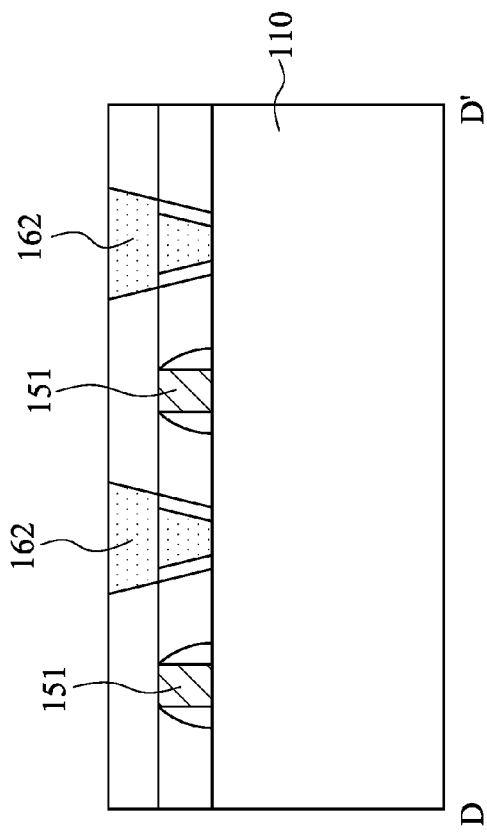
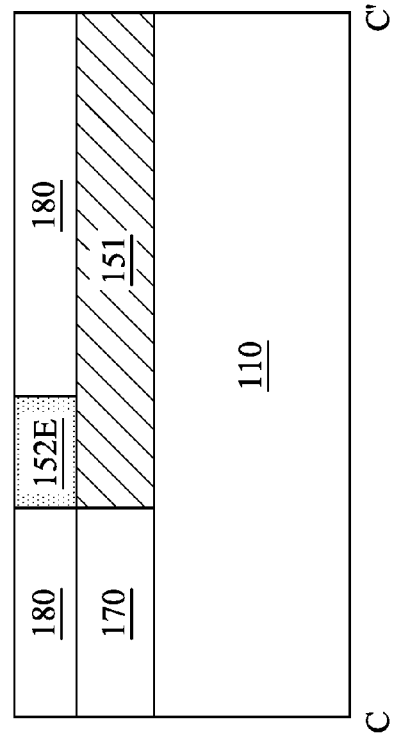
Fig. 11
Fig. 10

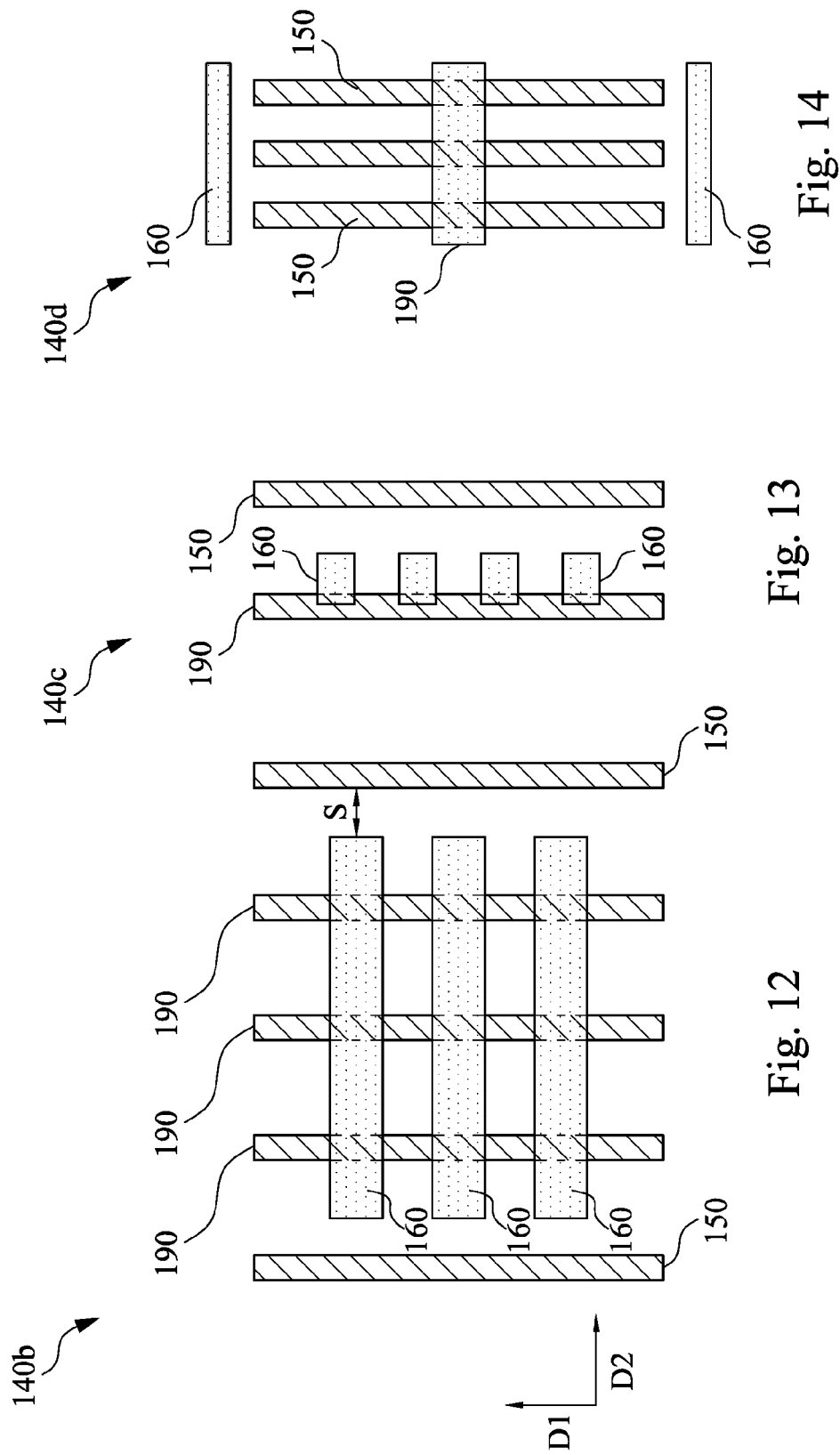

SEMICONDUCTOR DEVICE AND METHOD FOR MANUFACTURING THE SAME

RELATED APPLICATIONS

The present application is a divisional of U.S. application Ser. No. 14/516,673, filed on Oct. 17, 2014. The entire disclosures of the above application are hereby incorporated by reference herein.

BACKGROUND

The semiconductor integrated circuit (IC) industry has experienced rapid growth. Modern integrated circuits are made up of literally millions of active devices such as transistors and passive devices such as capacitors. Technological advances in IC materials and design have produced generations of ICs where each generation has smaller and more complex circuits than the previous generation. These devices are initially isolated from each other, but are later interconnected together through multiple metal layers to form functional circuits. As the IC becomes increasingly more complex, the density of active and passive devices in modern integrated circuits is significantly increased, and therefore it is required to decrease the dimension of these devices. Capacitors are key components commonly used in semiconductor integrated circuits. The capacitance of capacitors may be influenced when the areas of the capacitors are decreased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3 through 6 are cross-sectional views showing methods for forming the semiconductor device depicted in FIG. 2 at various stages according to various embodiments of the present disclosure.

FIG. 10 and FIG. 11 are cross-sectional views respectively taking along line C-C' and line D-D' in FIG. 9.

FIGS. 12-14 are top views schematically illustrating capacitors according to some embodiments of the present disclosure.

DETAILED DESCRIPTION

Figure 1:
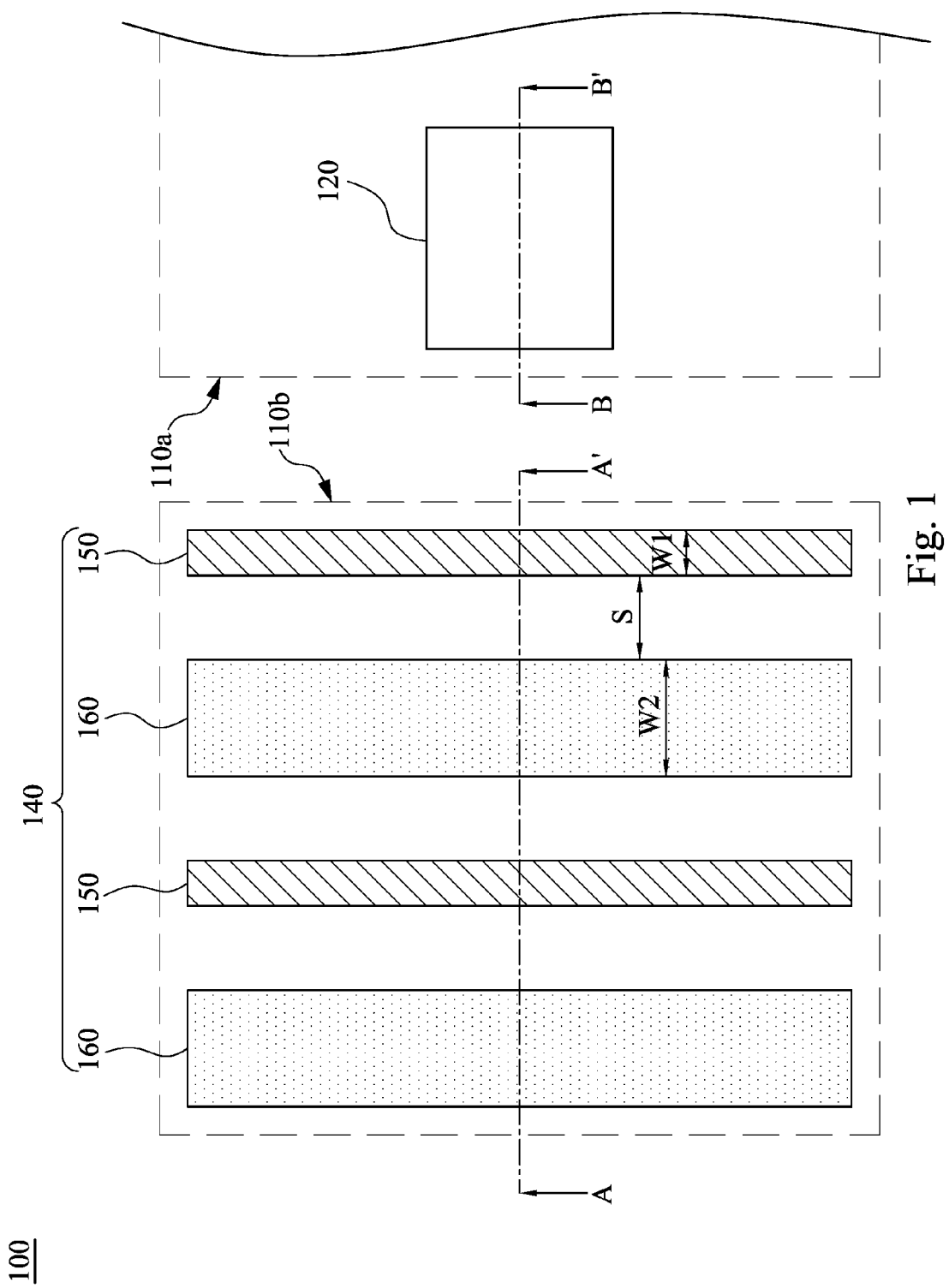
FIG. 1 is a top view schematically illustrating a semiconductor device according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. T and/or his repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure relates generally to a semiconductor device having one or more capacitors. In general, semiconductor processes may be classified into three stages, i.e. front-end-of line (FEOL) processes, middle-end-of line (MEOL) processes and back-end-of line (BEOL) processes. Typical capacitors of semiconductor circuits are formed in the BEOL processes, in which metal connection wires, vias and inter-metal dielectric (IMD) layers are formed. According to various embodiments of the present disclosure, one or more capacitors of the semiconductor device are formed in the MEOL processes and/or FEOL processes. In the present disclosure, the FEOL processes refer to the processes of forming transistors, whereas the MEOL processes refer to the processes of forming conductive contacts which electrically interconnect the transistors and the metal connection wires formed in the BEOL processes. Various embodiments of the present disclosure will be described in detail hereinafter.

According to various embodiments of the present disclosure, one or more capacitors of the semiconductor device are formed in the MEOL and/or FEOL processes. The dielectric layer used in the MEOL processes usually possesses a higher dielectric constant than that of the inter-metal dielectric (IMD) layers which is used in the BEOL processes. Furthermore, the characteristics of the MEOL and FEOL processes provide a smaller spacing interval between elements, as compared to the BEOL processes. Accordingly, the capacitors formed using MEOL and/or FEOL processes may have a higher capacitance and smaller occupied area than the capacitors formed in the BEOL processes.

Figure 2:
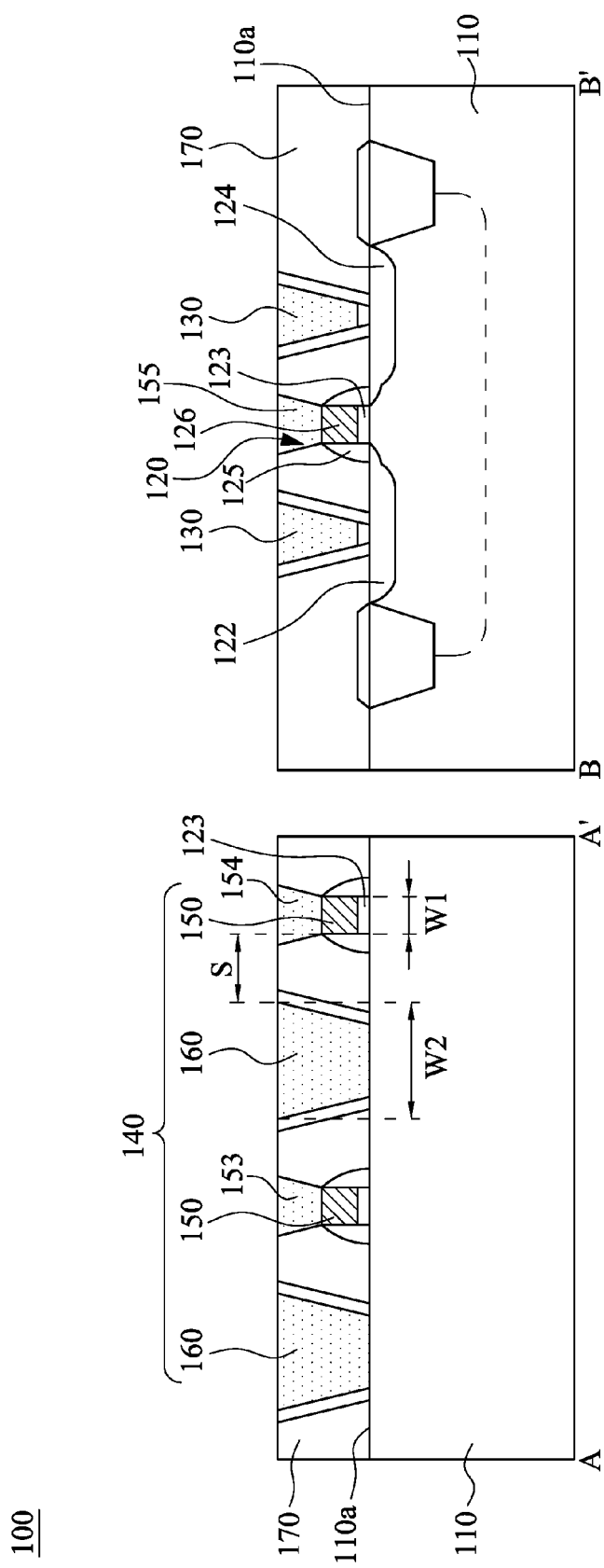
FIG. 2 is a cross-sectional view taking along line A-A' and line B-B' in FIG. 1.

FIG. 1 is a top view schematically illustrating a semiconductor device 100 according to various embodiments of the present disclosure. FIG. 2 is a cross-sectional view taking along lines A-A' and line B-B' in FIG. 1. The semiconductor device 100 includes a semiconductor substrate 110, a transistor 120, a conductive contact 130 and a capacitor 140.

According to some embodiments of the present disclosure, the semiconductor substrate 110 includes an active region 110a and a passive region 110b. One or more active element(s) such as transistor 120 may be formed in the active region 110a, whereas one or more passive element(s) such as capacitor 140 may be formed in the passive region 110b. In some embodiments, the semiconductor substrate 110 may include, for example, a silicon wafer, a semiconductor-on-insulator (SOI) substrate, a silicon germanium substrate or the like.

In some embodiments of the present disclosure, the transistor 120 includes a source 122, a drain 124 and a gate 126, as shown in FIG. 2. The source 122 and drain 124 may be, for example, heavily doped regions formed in the semiconductor substrate 110, and are arranged at different sides of the gate 126. In some examples, the gate 126 may include polycrystalline silicon or metallic material such as for example aluminum. In some embodiments, the transistor 120 further includes a dielectric layer 123 interposed between the gate 126 and the semiconductor substrate 110. In yet some embodiments, the transistor 120 further includes a spacer 125 formed on the sidewall of the gate 126. The transistor 120 may be, for example an NMOS transistor, a PMOS transistor or a CMOS transistor.

The conductive contact 130 is formed on and in contact with at least one of the source 122 and the drain 124. In some embodiments, the semiconductor device 100 may include a plurality of conductive contacts 130, and each of the conductive contacts 130 is connected to the source 122 or the drain 124.

The capacitor 140 includes at least a first electrode 150 and at least a second electrode 160, which is spaced apart from first electrode 150. The first electrode 150 and the second electrode 160 are configured to connect to opposite electricity so as to constitute the capacitor 140. It is noted that at least one of the first electrode 150 and the second electrode 160 extends on substantially the same level as the conductive contact 130 according to various embodiments of the present disclosure. In some embodiments, the first electrode 150 extends on substantially the same level as the gate 126, and the second electrode 160 extends on substantially the same level as the conductive contact 130. In specifics, the first electrode 150 is formed using the operations or processes that are included in the formation of the gate 126 using the FEOL processes, so that the first electrode 150 is similar in structure to the gate 126. In examples, the dielectric layer 123 may be interposed between the first electrode 150 and the semiconductor substrate 110. Accordingly, the first electrode 150 and the gate 126 are located on approximately the same level with respect to a principal surface 110a of the semiconductor substrate 110. In some embodiments, the first electrode 150 and the gate 126 include the same material. In yet some embodiments, the thickness of the first electrode 150 is substantially equal to the thickness of the gate 126. On the other hand, the second electrode 160 of the capacitor 140 is formed using the operations or processes that are included in the formation of the conductive contact 130 using the MEOL processes, so that the second electrode 160 is similar in structure to the conductive contact 130. Therefore, the second electrode 160 and the conductive contact 130 are positioned on approximately the same level with respect to the principal surface 110a of the semiconductor substrate 110. In some embodiments, the second electrode 160 and the conductive contact 130 include the same material. In yet some embodiments, the thickness of the second electrode 160 is substantially equal to the thickness of the conductive contact 130. In some examples, the first electrode 150 includes polycrystalline silicon, whereas the second electrode 160 includes metal such as for example tungsten.

The spacing interval S between the first electrode 150 and the second electrode 160 can be varied. In some embodiments, the spacing interval S between the first electrode 150 and the second electrode 160 may be ranged from about 10 nm to about 80 nm. In some examples, the spacing interval S may be ranged from about 10 nm to about 30 nm. In yet some examples, the spacing interval S may be ranged from about 20 nm to about 50 nm. In yet some examples, the spacing interval S may be ranged from about 40 nm to about 80 nm.

The width W1 of the first electrode 150 can be varied. In some embodiments, the width W1 of the first electrode 150 may be ranged from about 10 nm to about 80 nm. In some examples, the width W1 may be ranged from about 10 nm to about 30 nm. In yet some examples, the width W1 may be ranged from about 20 nm to about 50 nm. In yet some examples, the width W1 may be ranged from about 40 nm to about 80 nm.

The width W2 of the second electrode 160 can be varied. In some embodiments, the width W2 of the second electrode 160 may be ranged from about 20 nm to about 120 nm. In some examples, the width W2 may be ranged from about 30 nm to about 80 nm. In yet some examples, the width W2 may be ranged from about 40 nm to about 60 nm.

The thickness of the first electrode 150 can be varied. In some embodiments, the thickness of the first electrode 150 may be ranged from about 3 nm to about 100 nm. In some examples, the thickness of the first electrode 150 may be about 5 nm to about 80 nm. In yet some examples, the thickness of the first electrode 150 may be about 5 nm to about 72 nm. In yet some examples, the thickness of the first electrode 150 may be about 3 nm to about 60 nm.

The thickness of the second electrode 160 can be varied. In some embodiments, the thickness of the second electrode 160 may be ranged from about 10 nm to about 100 nm. In some examples, the thickness of the second electrode 160 may be about 30 nm to about 70 nm. In yet some examples, the thickness of the second electrode 160 may be about 10 nm to about 60 nm. In yet some examples, the thickness of the second electrode 160 may be about 40 nm to about 54 nm.

In various embodiments of the present disclosure, the capacitor 140 may include a plurality of first electrodes 150 and a plurality of second electrodes 160. In some embodiments, the first electrodes 150 and the second electrodes 160 are alternately arranged, as shown in FIG. 1. However, the layout of the first and second electrodes 150,160 may be varied, which is described in detail hereinafter.

According to some embodiments of the present disclosure, the semiconductor device 100 may further include a dielectric layer 170 covering the gate 126. The dielectric layer 170 further extends laterally to cover at least one of the second electrode 160 and the first electrode 150. In examples, as shown in FIG. 2, the dielectric layer 170 covers the first electrode 150 which has a thickness substantially equal to the thickness of the gate 126. In yet some examples, the semiconductor device 100 may further include a plurality of external contacts 153, 154, 155 embedded in the dielectric layer 170. Each of the external contacts 153, 154 is formed on one of the first electrodes 150 for providing electrical connection thereto. Similarly, the external contact 155 may be arranged on the gate 126 for providing electrical connection thereto. In yet some examples, the external contacts 153, 154, 155 may include the same material as the second electrode 160.

FIGS. 3 through 6 are cross-sectional views showing methods for forming the semiconductor device 100 depicted in FIG. 2 at various stages according to various embodiments of the present disclosure.

Figure 3:
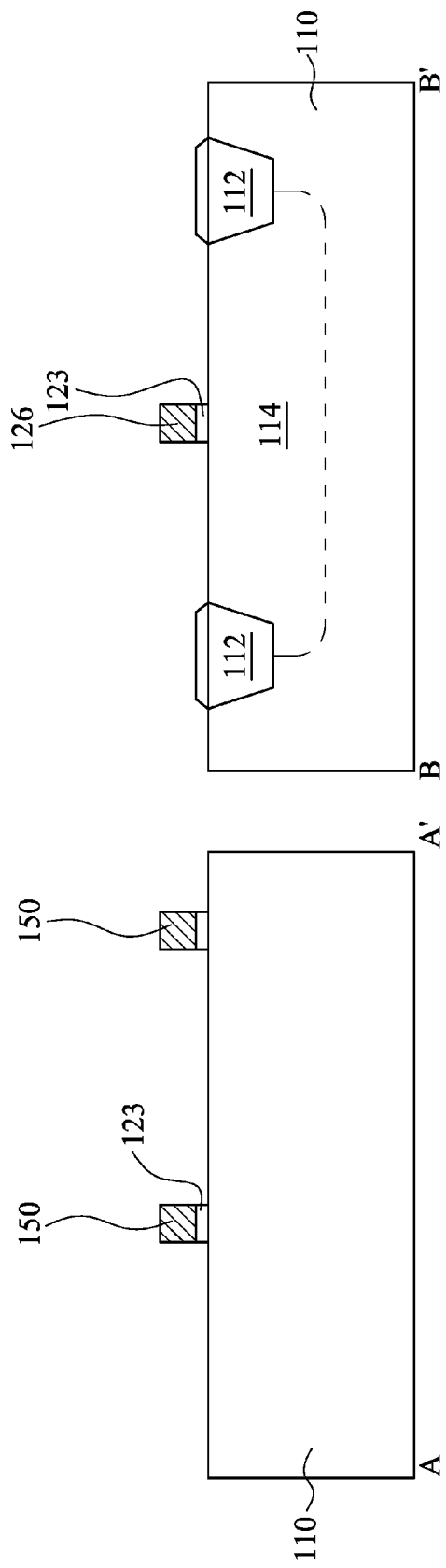

In FEOL processes, a transistor and one or more first electrodes of a capacitor are formed on a semiconductor substrate according to various embodiments of the present disclosure. In some embodiments, as shown in FIG. 3, a gate 126 and a plurality of first electrodes 150 are formed on a semiconductor substrate 110 by the same operations such that the first electrodes 150 extend on substantially the same level as the gate 126. In some examples, the material of the first electrodes 150 is substantially the same as that of the gate 126, and further the thickness of the first electrodes 150 substantially equals the thickness of the gate 126. In yet some embodiments, both the gate 126 and the first electrodes 150 are patterned by using the same photolithographic process and the same etching process, and therefore the gate 126 and the first electrodes 150 are simultaneously formed. In yet some embodiments, a doped well region 114 and an isolation structure 112 may be formed prior to forming the gate 126 and the first electrodes 150. In yet some embodiments, a dielectric layer 123 may be formed between the semiconductor substrate 110 and each of the first electrodes 150 and the gate 126.

Figure 4:
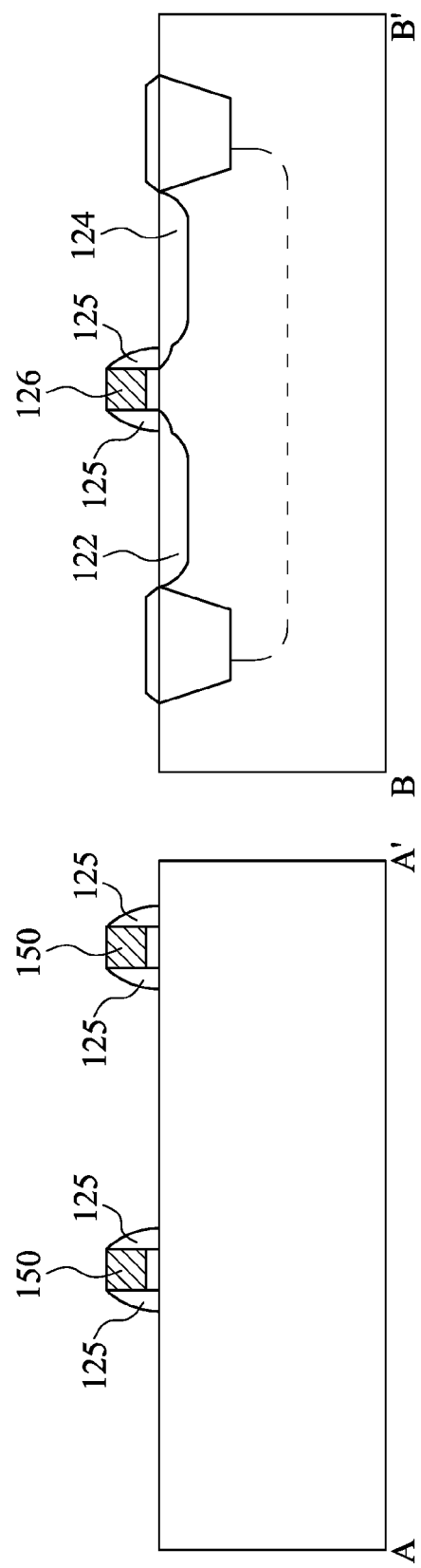

As shown in FIG. 4, a source 122 and a drain 124 of the transistor are formed on the semiconductor substrate 110 according to some embodiments of the present disclosure. For example, the source 122 and drain 124 may be formed by one or more ion implantation processes. The implanted species depends on the type of the transistor being fabricated, such as an NMOS or a PMOS device. In some embodiments, spacers 125 may be formed on the sidewalls of the gate 126 and the first electrodes 150.

In MEOL processes, a conductive contact and one or more second electrodes of the capacitor are formed on the semiconductor substrate according to various embodiments of the present disclosure. As shown in FIG. 5, in some embodiments, a dielectric layer 170 is formed over the semiconductor substrate 110 and covers the gate 126 and the first electrodes 150 in a blanket manner. In some embodiments, the dielectric layer 170 may be an inter-layer dielectric (ILD) layer and made of a material such as, for example, undoped silica glass (USG), borosilicate glass (BSG), borophosphosilicate (BPSG), and the like. In yet some embodiments, the dielectric layer 170 includes a high-k dielectric material such as, hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO) or other suitable high-k dielectric materials. In some examples, the dielectric constant of the dielectric layer 170 is ranged from about 3.0 to about 3.5. Any suitable method may be employed to form the first dielectric layer 120. For example, chemical vapor deposition (CVD) techniques, plasma-enhanced CVD (PECVD) techniques, atomic layer deposition (ALD) techniques, physical vapor deposition (PVD) techniques and the like may be utilized.

Figure 6:
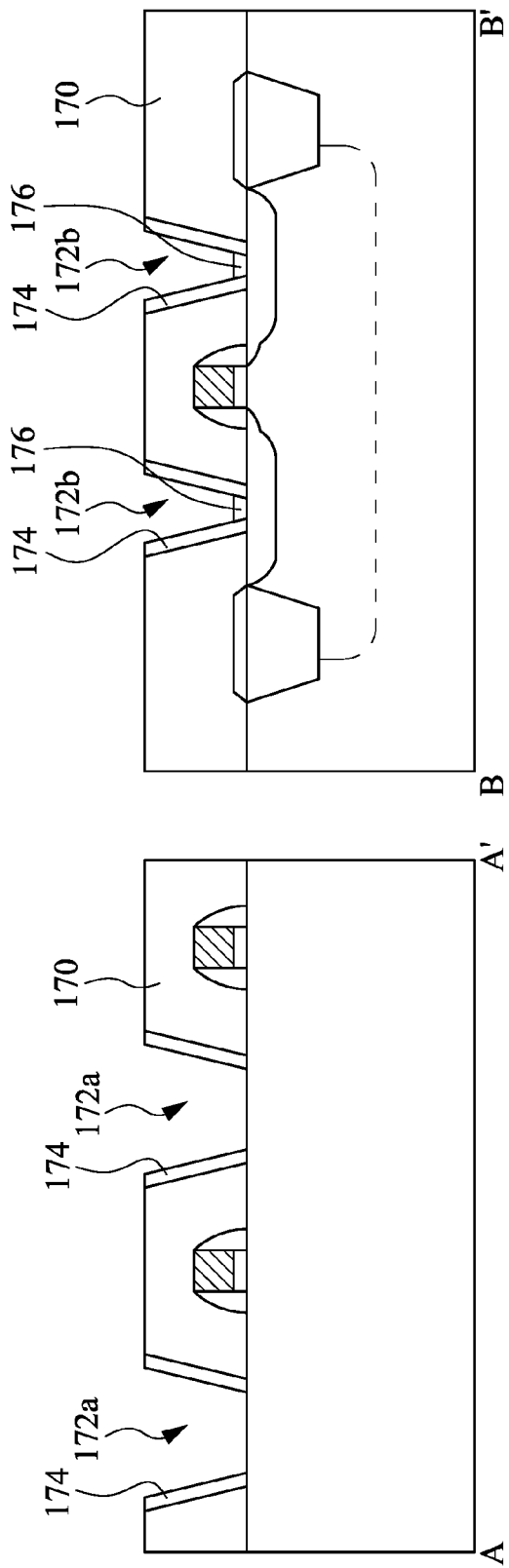

As shown in FIG. 6, a plurality of trenches 172a and openings 172b are formed within the dielectric layer 170 according to some embodiments of the present disclosure. The trenches 172a and openings 172b penetrate through the dielectric layer 170. Further, the openings 172b locate on the source 122 and drain 124, and thereby exposing portions of the source 122 and drain 124. In some embodiments, after forming the trenches 172a and the openings 172b, an anti-etch layer (or barrier later) 174 may be formed on the sidewalls of the trenches 172a and on the sidewall of the openings 172b. The anti-etch layer 174 may be a single-layered structure or a multiple-layered structure. For example, the anti-etch layer 174 may include a layer of silicon oxide, silicon nitride or the like and a layer of silicon carbide or the like formed thereon. In some embodiments, after forming anti-etch layer 174, a conductivity-enhancing layer 176 such as for example a nickel silicide (NiSi) layer is formed on the bottom of the opening 172b. In some examples, the conductivity-enhancing layer 176 may further be formed on the bottoms of the trenches 172a although FIG. 6 depicts that the conductivity-enhancing layer 176 is only formed in the opening 172b.

In some embodiments, after forming the trenches 172a and the openings 172b, a plurality of second electrodes 160 and conductive contacts 130 are formed in the trenches 172a and the openings 172b, and therefore the semiconductor structure shown in FIG. 2 is obtained. In examples, the second electrodes 160 and the conductive contacts 130 may be formed using the same operations. For instance, a conductive layer may be blanketly deposited over the dielectric layer 170 and filled in the trenches 172a and the openings 172b. In various examples, the conductive layer includes metal such as for example tungsten (W). Subsequently, a chemical mechanical polishing (CMP) process is performed to remove the conductive layer on the dielectric layer 170, and thereby forming the first electrodes 150 and the second electrodes 160 of the capacitor 140 shown in FIG. 2. Accordingly, the second electrodes 160 extend on substantially the same level as the conductive contacts 130 in accordance with some embodiments of the present disclosure.

Figure 7:
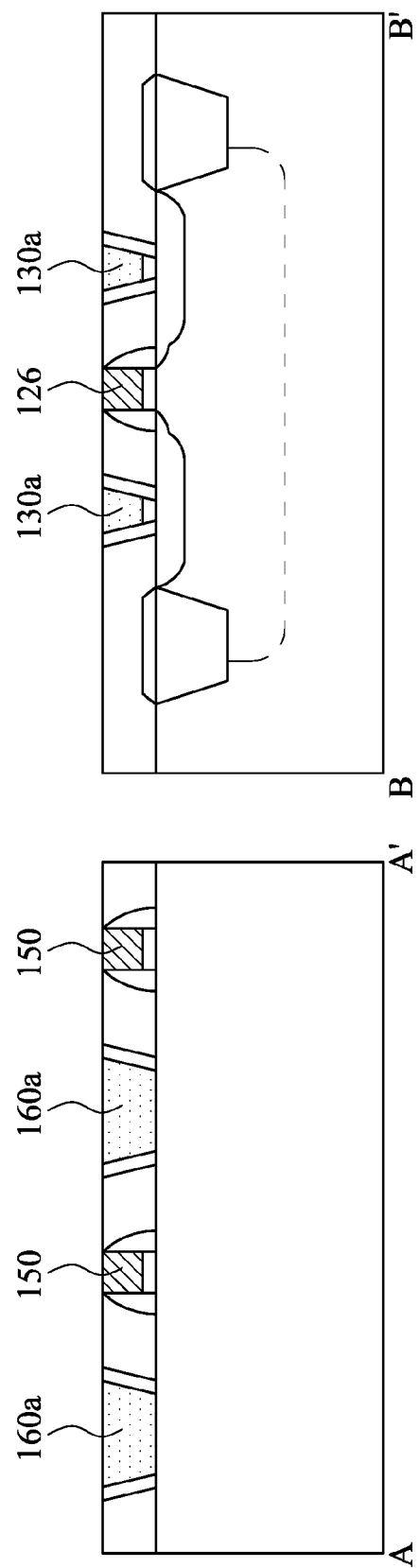
FIG. 7 is a cross-sectional view schematically illustrating a semiconductor device according to various embodiments of the present disclosure.

In yet some embodiments, as shown in FIG. 7, the MEOL processes may further include a CMP process to remove portions of the dielectric layer 170 and the conductive material in the trenches 172a and the openings 172b such that the top surfaces of the gate 126 and the first electrodes 150 are exposed. Therefore, in some examples, the first electrodes 150, the second electrodes 160a, the gate 126 and the conductive contacts 130a are of substantially equal thickness.

Figure 8:
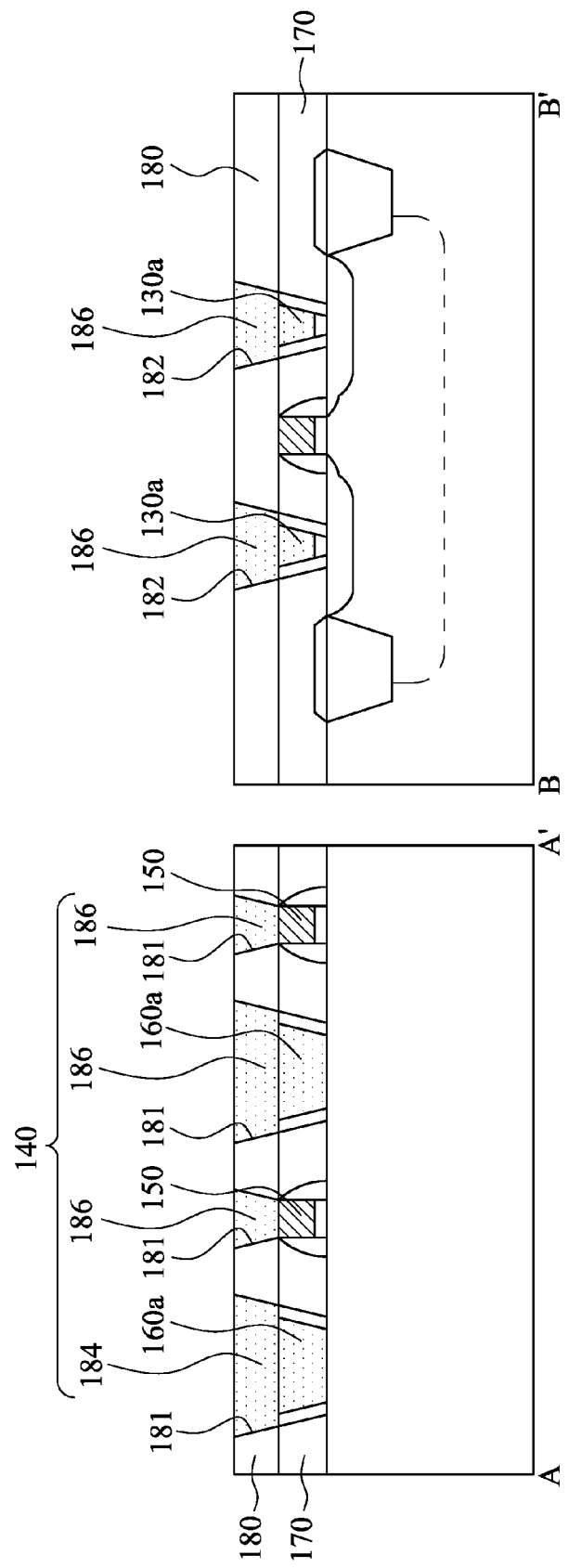
FIG. 8 is a cross-sectional view schematically illustrating a semiconductor device according to various embodiments of the present disclosure.

In yet some embodiments, as shown in FIG. 8, the MEOL processes may further include an operation of forming a dielectric layer 180 on the semiconductor structure depicted in FIG. 7. The dielectric layer 180 has a plurality of trenches 181, 182 penetrating through the dielectric layer 180. Each of the first and second electrodes 150, 160a is partially or completely exposed through a respective trench 181, and each of the conductive contacts 130a is partially or completely exposed through a respective trench 182. In yet some embodiments, the MEOL processes may further include an operation of forming conductive material 184 in the trenches 181 and trenches 182. In some examples, the conductive material 184 and the conductive contacts 130a may have substantially the same composition. Furthermore, each of the first and second electrodes 150, 160a is in contact with the conductive material 184 positioned thereon, and therefore the capacitance of the capacitor 140 may be increased due to the increase in the thickness of the electrodes of the capacitor. Accordingly, in some embodiments, the first electrode of the capacitor may include a bottom portion and an upper portion stacked thereon. The bottom portion includes the same material as the gate 126, and the upper portion includes the same material as the conductive contact 130a. In addition, conductive contacts 130a are in contact with the conductive material 186 positioned thereon.

Figure 9:
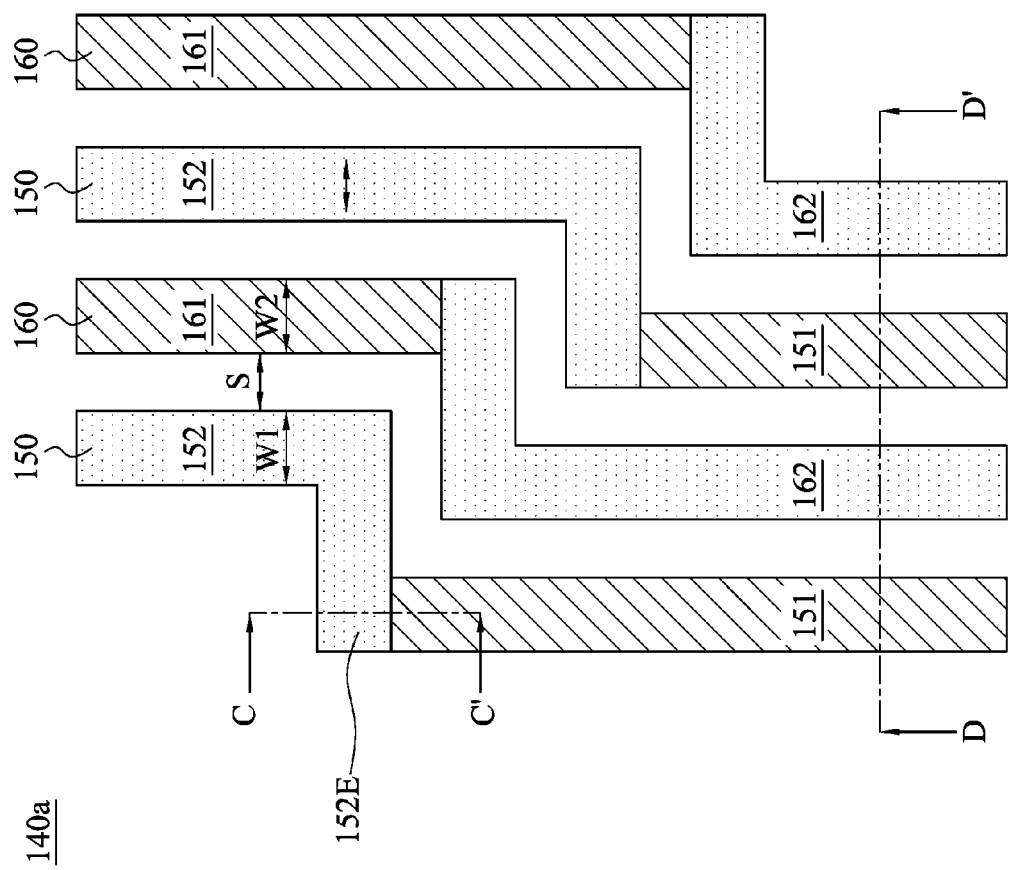
FIG. 9 is a top view schematically illustrating a capacitor formed in a passive region on a semiconductor substrate according to various embodiments of the present disclosure.

FIG. 9 is a top view schematically illustrating a capacitor 140a formed in a passive region on a semiconductor substrate according to various embodiments of the present disclosure. FIG. 10 and FIG. 11 are cross-sectional views respectively taking along line C-C' and line D-D' in FIG. 9. The capacitor 140a includes a plurality of first electrodes 150 and a plurality of second electrodes 160, and further each of the first and second electrodes 150, 160 is a hybrid electrode. In some embodiments, each first electrode 150 has a first portion 151 formed using FEOL processes and a second portion 152 formed using MEOL processes. For example, the first portion 151 is formed using the same process as that of forming a gate of a transistor (not shown in FIG. 9), whereas the second portion 152 is formed using the same process as that of forming a conductive contact on a source and/or a drain (not shown in FIG. 9). The second portion 152 has an end 152E laid on the first portion 151 such that the first portion 151 is electrically connected to the second portion 152. Similarly, in some examples, each second electrode 160 has a first portion 161 formed using the same process as the gate, and a second portion 162 formed using the same process as the conductive contact. The first electrodes 150 and the second electrodes 160 are connected to opposite electricity so as to constitute the capacitors 140a. In some examples, the spacing interval S between the first and second electrodes 150, 160 adjacent to each other may be ranged from about 10 nm to about 50 nm. In yet some examples, the width W1 and width W2 of the first and second electrodes 150, 160 may be ranged from about 10 nm to about 80 nm.

The layout of the capacitor disclosed herein may be varied. FIGS. 12-14 are top views schematically illustrating capacitors 140b, 140c and 140d according to various embodiments of the present disclosure.

As shown in FIG. 12, the capacitor 140b includes a pair of first electrodes 150, a plurality of second electrodes 160 and a plurality of connecting lines 190. The first electrodes 150 and the connecting lines 190 are formed using the same process as that of forming a gate (not shown in FIG. 12), and extend on substantially the same level as the gate. The second electrodes 160 are formed using the same process as that of forming a conductive contact on a source or drain, and extend on substantially the same level as the conductive contact. The first electrodes 150 extend in a first direction D1, whereas the second electrodes 160 extend in a second direction D2. The first electrodes 150 and the second electrodes 160 are configured to connect to opposite electricity so that electrical charges may be stored in the dielectrics between each first electrode 150 and each end of the second electrodes 160. The connecting lines 190 are in contact with the second electrodes 160 at the intersections thereof so as to apply certain electricity to the second electrodes 160.

As shown in FIG. 13, the capacitor 140c includes a first electrode 150, a connecting line 190 and a plurality of second electrodes 160. The first electrode 150 and the connecting line 190 are formed in the operations of forming a gate, and extend on substantially the same level as the gate. The second electrodes 160 are formed using the same operations as that of forming a conductive contact on a source or drain, and extend on substantially the same level as the conductive contact. Each second electrode 160 has an end in contact with the connecting line 190 and an opposite end adjacent to the first electrode 150. The second electrodes 160 are coupled to certain electricity through the connecting line 190. Capacitors are formed between the first electrode 150 and the opposite ends of the second electrodes 160.

As shown in FIG. 14, the capacitor 140c includes a plurality of first electrodes 150, a pair of second electrodes 160 and a connecting line 190. The first electrodes 150 are formed in the same operations as that of forming a gate, and extend on substantially the same level as the gate. The second electrodes 160 and the connecting line 190 are formed using the same operations as that of forming a conductive contact on a source or drain. The second electrodes 160 and the connecting line 190 extend on substantially the same level as the conductive contact. The first electrodes 150 and the second electrodes 160 are configured to connect to opposite electricity so that capacitors are formed between each second electrode 160 and the ends of the first electrodes 150. The connecting line 190 is in contact with the first electrodes 150 at the intersections thereof so as to apply certain electricity to the first electrodes 150.

Figure 15:
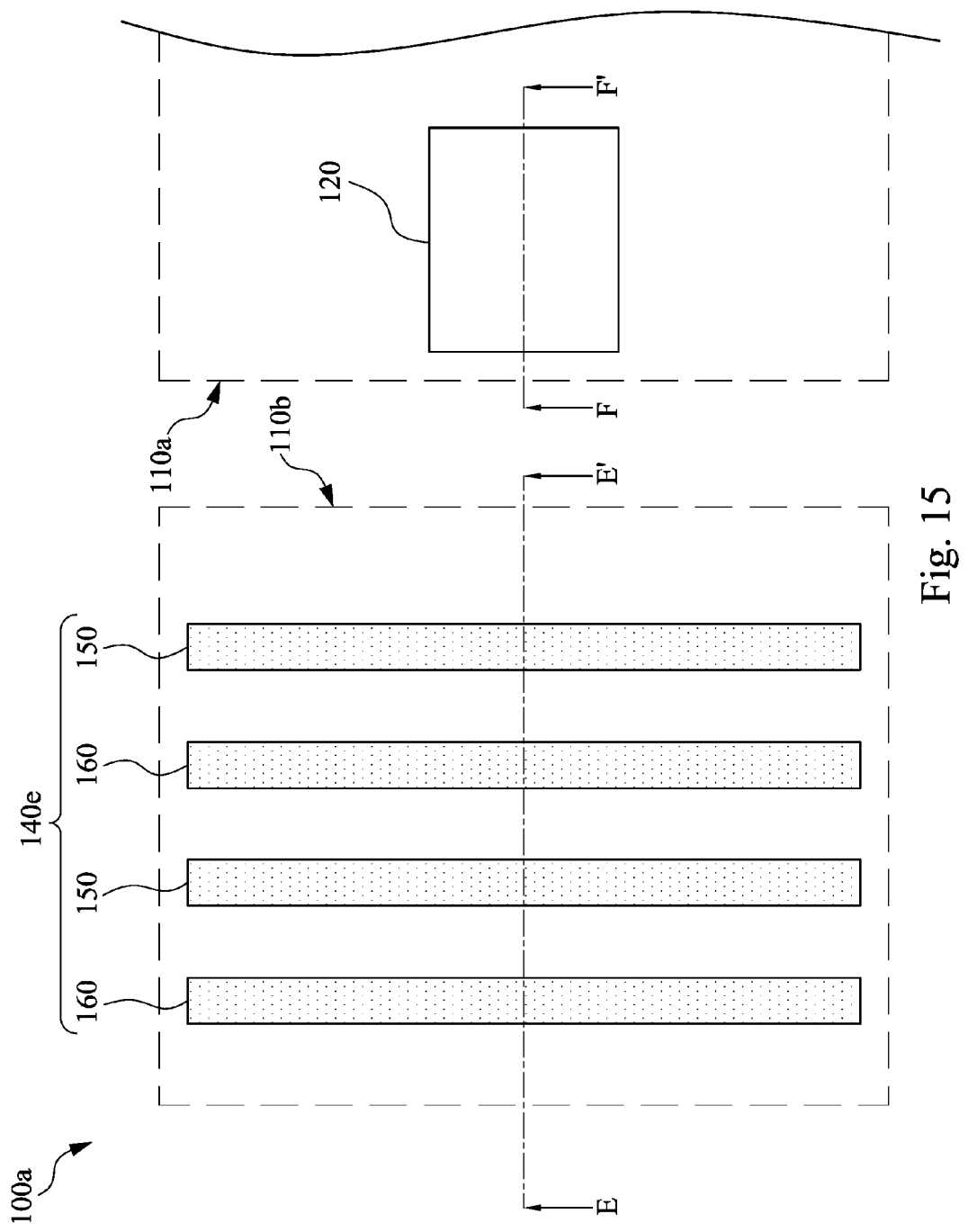
FIG. 15 is a top view schematically illustrating a semiconductor device according to various embodiments of the present disclosure.
Figure 16:
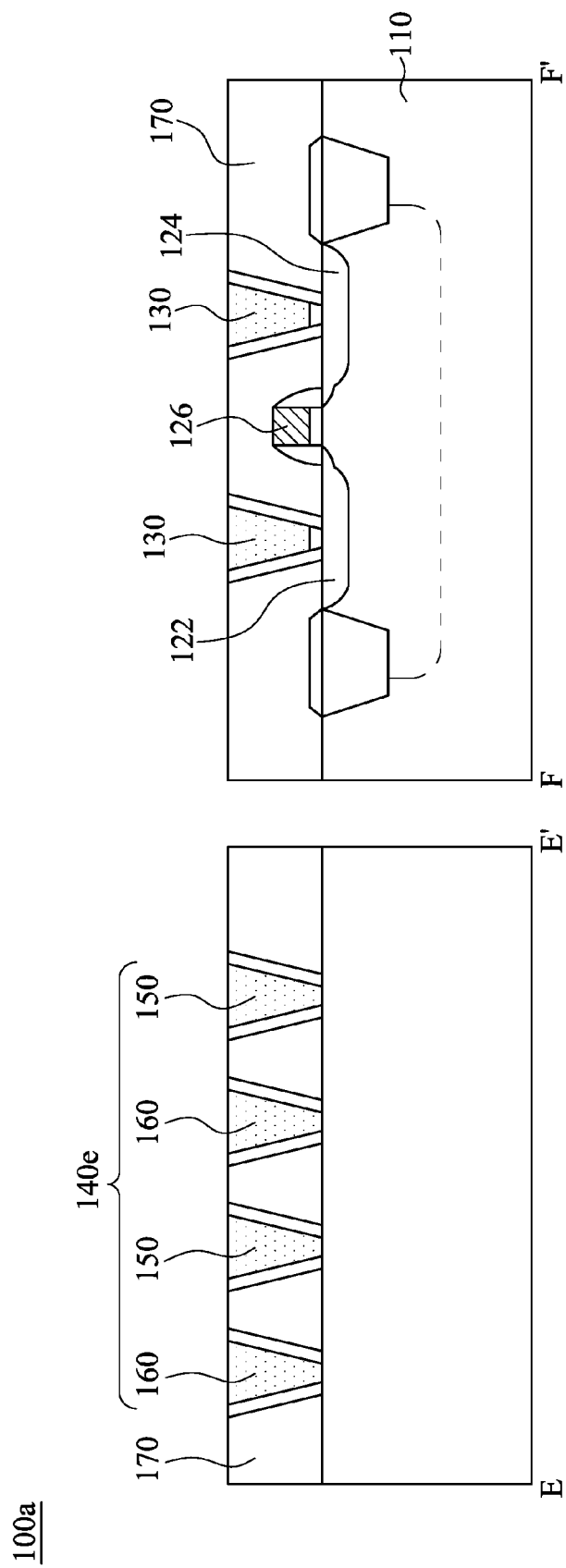
FIG. 16 is a cross-sectional view taking along lines E-E' and line F-F' in FIG. 15.

The present disclosure is not limited to the capacitor having electrodes formed using both of the FEOL processes and the MEOL processes. FIG. 15 is a top view schematically illustrating a semiconductor device 100a according to various embodiments of the present disclosure. FIG. 16 is a cross-sectional view taking along lines E-E' and line F-F' in FIG. 15. In FIG. 15 and FIG. 16, the same or similar features are identified by the same reference numerals. These features are the same as or similar to like-numbered features described with respect to FIG. 1 and FIG. 2. Therefore, the description will be omitted to avoid repetition. The semiconductor device 100a features in that the capacitor 140e is formed using MEOL processes only. As shown in FIG. 16, the capacitor 140e includes a plurality of first electrodes 150 and a plurality of second electrodes 160. The first and second electrodes 150, 160 extend on substantially the same level as the conductive contacts 130. In some examples, all of the first and second electrodes 150, 160 are formed using the same operations or processes as the conductive contacts 130, so that the first and second electrodes 150, 160 and the conductive contacts 130 are simultaneously formed. The first electrodes 150 and the second electrodes 160 are respectively configured to connect to opposite electricity so as to constitute the capacitor 140e. In some embodiments, each of the first electrodes 150 and the second electrodes 160 has a thickness substantially equal to the thickness of the conductive contact 130. In some embodiments, the dielectric layer 170 of the semiconductor device 100a covers the gate 126 and laterally extends to a position between the first electrodes 150 and the second electrodes 160. In some examples, the dielectric layer 170 has a dielectric constant ranged from about 3.0 to about 3.5. In yet some embodiments, the dielectric layer 170, the first electrode 150, the second electrode 160 and the conductive contact 130 are of substantially equal thickness.

Figure 17:
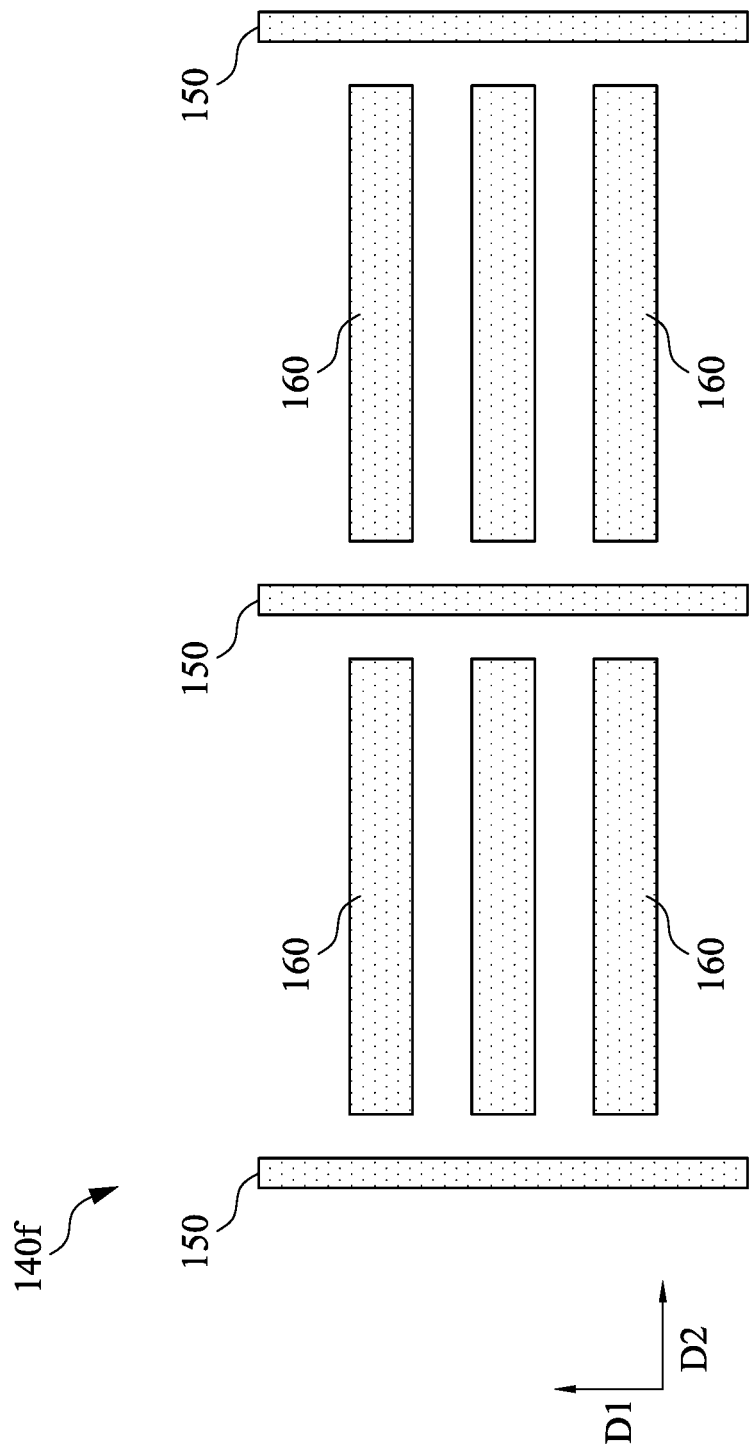
FIGS. 17-19 are top views schematically illustrating capacitors formed using the MEOL processes according to various embodiments of the present disclosure.
Figure 18:
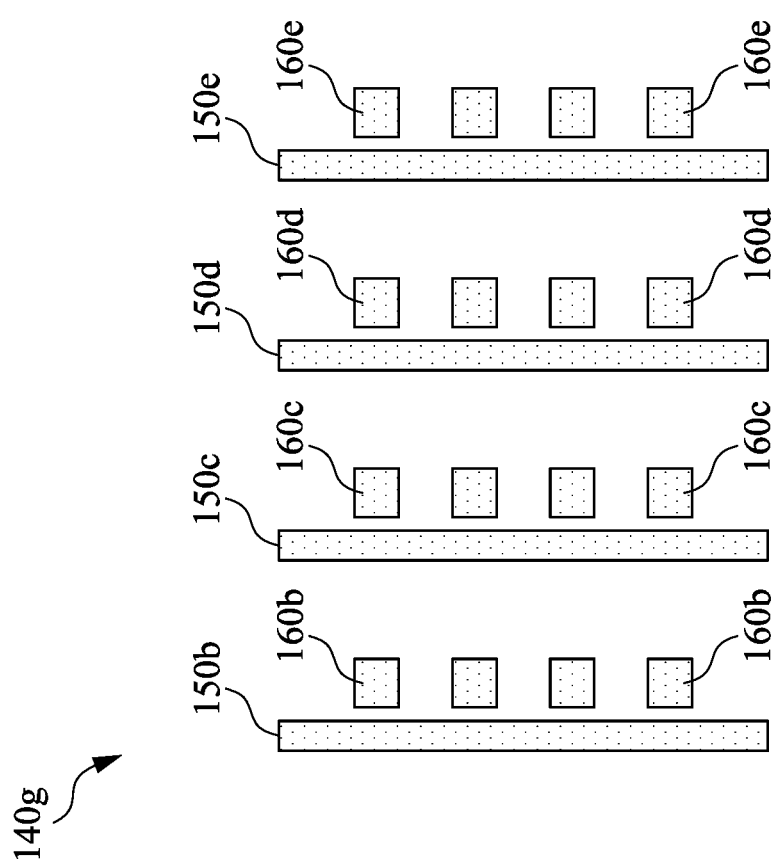
Figure 19:
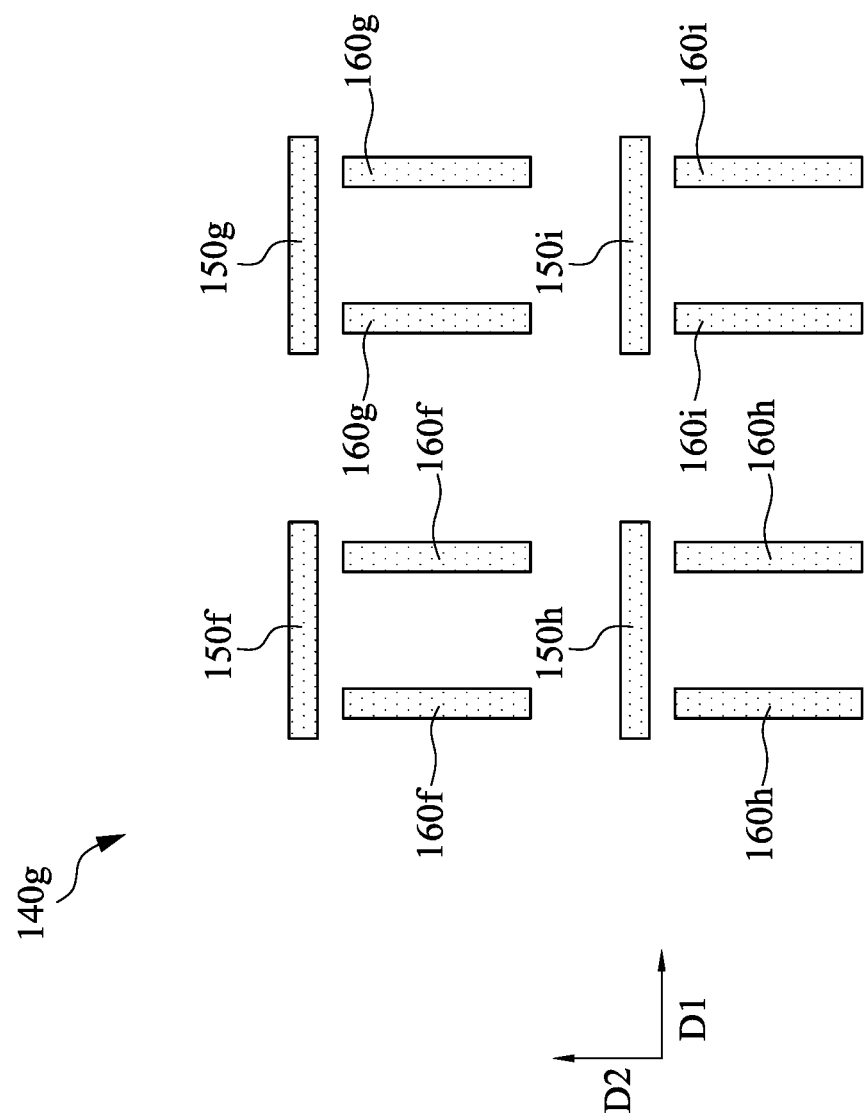

FIGS. 17-19 are top views schematically illustrating capacitors 140f, 140g and 140h formed using the MEOL processes according to various embodiments of the present disclosure. As shown in FIG. 17, the capacitor 140f includes a plurality of first electrodes 150 and a plurality of second electrodes 160. The first and second electrodes 150, 160 extend on substantially the same level as a conductive contact on a source or drain. The first electrodes 150 extend in a first direction D1, whereas the second electrodes 160 extend in a second direction D2. In some embodiments, the first direction D1 is substantially perpendicular to the second direction D2. Further, each second electrode 160 is arranged between two adjacent first electrodes 150. The first electrodes 150 and the second electrodes 160 are configured to connect to opposite electricity so that electrical charges may be stored in the dielectrics between each first electrode 150 and the ends of the second electrodes 160. In FIG. 18, the capacitor 140g includes a plurality of first electrodes 150b-150e and a plurality of second electrodes 160b-160e. Each of the second electrodes 160b-160e is in a square shape, and each of the first electrodes 150b-150e is in a rectangular shape. In some examples, the width of each second electrode 160b-160e may be ranged from about 20 nm to about 100 nm. Further, the second electrodes 160b, 160c, 160d, and 160e are arranged respectively adjacent to the first electrodes 150b, 150c, 150d and 150e. For instance, the second electrodes 160b are arranged adjacent to the first electrode 150b, and the second electrodes 160c are arranged adjacent to the first electrode 150c. The first electrodes 150b-150e and the second electrodes 160b-160e are configured to connect to opposite electricity so that electrical charges may be stored in the dielectrics between each first electrode 150b-150e and the second electrodes 160b-160e adjacent thereto. In FIG. 19, the capacitor 140h includes a plurality of first electrodes 150f-150i and a plurality of second electrodes 160f-160i. Each of the first electrodes 150f-150i extends in a first direction D1 and each of the second electrodes 160f-160i extends in a second direction D2. In example, the first direction D1 is perpendicular to the second direction D2. Further, the second electrodes 160f, 160g, 160h, and 160i are arranged respectively adjacent to the first electrodes 150f, 150g, 150h and 150i. For instance, each second electrode 160f has an end adjacent to the first electrode 150f, and the each second electrode 160g has an end adjacent to the first electrode 150g. The first electrodes 150f-150i and the second electrodes 160f-160i are configured to connect to opposite electricity so that electrical charges may be stored in the dielectric material between each first electrode and the ends of the second electrodes adjacent thereto.

Figure 20:
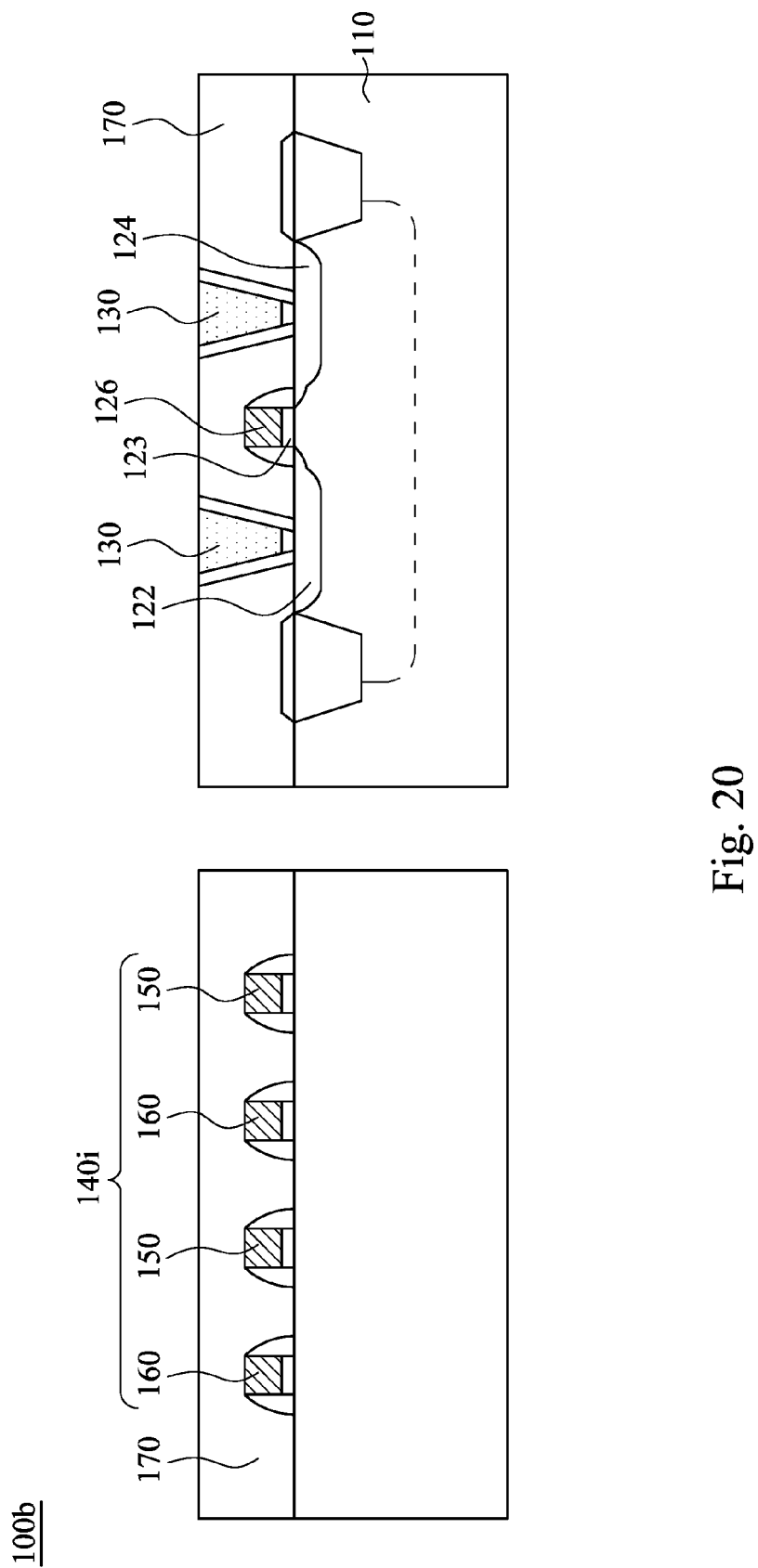
FIG. 20 is a cross-sectional view schematically illustrating a semiconductor device using the FEOL processes according to some embodiments of the present disclosure.

According to various embodiments of the present disclosure, the capacitor may be formed using FEOL processes. FIG. 20 is a cross-sectional view schematically illustrating a semiconductor device 100b according to some embodiments of the present disclosure. In FIG. 20, the same or similar features are identified by the same reference numerals. These features are the same as or similar to like-numbered features described with respect to FIG. 2. Therefore, the description will be omitted to avoid repetition. The semiconductor device 100b features in that the capacitor 140i is formed using FEOL processes only. As shown in FIG. 20, the capacitor 140i includes a plurality of first electrodes 150 and a plurality of second electrodes 160. The first and second electrodes 150, 160 extend on substantially the same level as the gate 126. In some examples, all of the first and second electrodes 150, 160 are formed using the same operations or processes as the gate 126, so that the first and second electrodes 150, 160 and the gate 126 are simultaneously formed. The first electrodes 150 and the second electrodes 160 are configured to connect to opposite electricity so as to constitute the capacitor 140i. In some embodiments, each of the second electrode 160 and the first electrode 150 has a thickness substantially equal to the thickness of the gate 126. In some embodiments, the dielectric layer 170 of the semiconductor device 100b covers the gate 126 and laterally extends to cover the first and second electrodes 150, 160 so that a portion of the dielectric layer 170 is interposed between each first electrode 150 and each second electrode 160.

Advantages of various embodiments of the present disclosure include providing novel capacitors of semiconductor devices and the methods for manufacturing the capacitors. The capacitors disclosed herein are formed in the MEOL and/or FEOL processes. It is noted that the dielectric layer used in the MEOL processes usually possesses a higher dielectric constant than that of the inter-metal dielectric (IMD) layers which is used in the BEOL processes. Furthermore, the characteristics of the MEOL and FEOL processes provide a smaller spacing interval between conductive lines, as compared to BEOL processes. Accordingly, the capacitors formed using MEOL and/or FEOL processes may have a higher capacitance and smaller occupied area, as compared to the capacitors formed using the BEOL processes. Moreover, the capacitor disclosed herein may be formed simultaneously with the formation of the gate and/or the conductive contact, and therefore the fabrication of the capacitor is cost-effective.

In accordance with one aspect of some embodiments, a semiconductor device includes a semiconductor substrate, a transistor, a conductive contact and a capacitor. The transistor is formed on the semiconductor substrate, and the transistor includes a source and a drain. The conductive contact is formed on and in contact with at least one of the source and the drain. The capacitor includes a first electrode and a second electrode spaced apart from first electrode. At least one of the first and second electrodes extends on substantially the same level as the conductive contact.

In accordance with another aspect of some embodiments, a semiconductor device includes a semiconductor substrate, a transistor, a capacitor and a dielectric material. The semiconductor substrate has an active region and a passive region adjacent to the active region. The transistor, which has a gate, is disposed in the active region. The capacitor is disposed in the passive region, and includes a first electrode and a second electrode spaced apart from the second electrode, in which at least one of the first and second electrodes extends on substantially the same level as the gate of the transistor. The dielectric material is interposed between the second electrode and the first electrode.

In accordance with another aspect of some embodiments, a method for manufacturing a semiconductor device is provided. The method includes the following operations: (i) forming a transistor having a source, a drain and a gate on a semiconductor substrate; (ii) forming a conductive contact located on and in contact with at least one of the source and the drain; and (iii) forming a capacitor having a first electrode and a second electrode on the semiconductor substrate, in which at least one of the first and second electrodes is The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a transistor having a source, a drain, and a gate on a semiconductor substrate;
    forming a conductive contact located on and in contact with at least one of the source and the drain; and
    forming a capacitor having a first electrode and a second electrode on the semiconductor substrate, at least one of the first and second electrodes being formed using front-end-of line (FEOL) processes or middle-end-of line (MEOL) processes,
    wherein the first electrode and the second electrode are laid on a substantially identical level relative to the semiconductor substrate.

2. The method according to claim 1, wherein the first electrode is formed using the same process as the gate, and the second electrode is formed using the same process as the conductive contact.

3. The method according to claim 1, wherein both the first electrode and the second electrode are formed using the same process as the conductive contact.

4. The method according to claim 1, wherein both the first electrode and the second electrode are formed using the same process as the gate.

5. A method for manufacturing a semiconductor device, comprising:
    receiving a semiconductor substrate having an active region and a passive region;
    forming a gate in the active region and a first electrode in the passive region;
    forming source/drain features in the active region of the semiconductor substrate and adjacent to the gate; and
    forming a conductive contact in contact with the source/drain features and a second electrode in the passive region, the second electrode being laterally spaced apart from the first electrode, wherein the first electrode and the second electrode constitute a capacitor.

6. The method according to claim 5, wherein the gate and the first electrode comprises an identical material.

7. The method according to claim 5, wherein the first electrode extends on a same level as the gate.

8. The method according to claim 5, wherein the gate and the first electrode are concurrently formed.

9. The method according to claim 5, wherein the conductive contact and the second electrode comprises an identical material.

10. The method according to claim 5, wherein the second electrode extends on a same level as the conductive contact.

11. The method according to claim 5, wherein the conductive contact and the second electrode are formed using a same photolithographic process.

12. The method according to claim 5, wherein the conductive contact and the second electrode are concurrently formed.

13. The method according to claim 5, wherein forming the conductive contact and the second electrode comprises:
    forming a dielectric layer over the active region and the passive region, wherein the dielectric layer has an opening exposing the source/drain features and a trench adjacent to the first electrode in the passive region; and
    filling a conductive material in the opening and the trench so to form the conductive contact and the second electrode respectively.

14. A method for manufacturing a semiconductor device, comprising:
    receiving a semiconductor substrate having an active region and a passive region;
    forming a gate in the active region;
    forming source/drain features in the active region and adjacent to the gate; and
    forming a conductive contact in contact with the source/drain features and a first electrode and a second electrode in the passive region, the first and second electrodes being laterally spaced apart from each other, wherein the first electrode and the second electrode constitute a capacitor.

15. The method according to claim 14, wherein the conductive contact, the first electrode, and the second electrode comprise a same material.

16. The method according to claim 14, wherein the first and second electrodes extend on a same level as the conductive contact.

17. The method according to claim 4, wherein the conductive contact and the first and second electrodes are concurrently formed.

18. A method for manufacturing a semiconductor device, comprising:
    receiving a semiconductor substrate having an active region and a passive region;
    forming a gate in the active region and a first electrode and a second electrode in the passive region, wherein the first and second electrodes are laterally spaced apart from each other, and constitute a capacitor;
    forming source/drain features in the active region of the semiconductor substrate and adjacent to the gate; and
    forming a conductive contact in contact with the source/drain features.

19. The method according to claim 18, wherein the first and second electrodes extend on a same level as the gate.

* * * * *